(12) United States Patent
Reimers

(10) Patent No.: US 11,262,220 B2
(45) Date of Patent: Mar. 1, 2022

(54) PHASE SENSING OF AN OBJECT

(71) Applicant: Tactual Labs Co., New York, NY (US)

(72) Inventor: Michael Reimers, Austin, TX (US)

(73) Assignee: Tactual Labs Co., New York, NY (US)

( * ) Notice: Subject to any disclaimer, the term of this patent is extended or adjusted under 35 U.S.C. 154(b) by 0 days.

(21) Appl. No.: 16/912,202

(22) Filed: Jun. 25, 2020

(65) Prior Publication Data

US 2020/0408568 A1    Dec. 31, 2020

Related U.S. Application Data

(60) Provisional application No. 62/866,934, filed on Jun. 26, 2019.

(51) Int. Cl.
*G01D 5/243* (2006.01)

(52) U.S. Cl.
CPC .................................... *G01D 5/243* (2013.01)

(58) Field of Classification Search
CPC ......... G01D 5/243; G01B 7/003; G01P 13/00; H03K 2217/96072; H03K 17/955
USPC ........................................................ 324/709
See application file for complete search history.

(56) References Cited

U.S. PATENT DOCUMENTS

| | | | | |
|---|---|---|---|---|
| 5,869,968 A | * | 2/1999 | Brooks | G01V 3/30 324/338 |
| 2016/0146895 A1 | * | 5/2016 | Yazami | B60L 1/003 324/426 |
| 2017/0187419 A1 | * | 6/2017 | Zhang | H04B 3/32 |
| 2019/0042032 A1 | * | 2/2019 | Moseley | G06F 3/046 |

* cited by examiner

*Primary Examiner* — Farhana A Hoque
(74) *Attorney, Agent, or Firm* — Adam Landa

(57) ABSTRACT

A sensing system adapted to determine changes in phase when a capacitive object enters into the phase detection zone created by a pair of transmitting conductors. One of the transmitting conductors has a receiving conductor located proximate to it and transmits a signal at a certain frequency. The other transmitting conductor transmits a signal that is phase shifted from the signal transmitted by the other transmitting conductor. Capacitive objects entering the space between the two transmitting conductors impacts the phase. Measurements of the change in phase are used to determine the position of an object between the two transmitting conductors.

19 Claims, 3 Drawing Sheets

PHASE SENSING OF AN OBJECT

This application claims the benefit of U.S. Provisional Application No. 62/866,934 filed Jun. 26, 2019, the contents of which are incorporated herein by reference. This application includes material which is subject to copyright protection. The copyright owner has no objection to the facsimile reproduction by anyone of the patent disclosure, as it appears in the Patent and Trademark Office files or records, but otherwise reserves all copyright rights whatsoever.

FIELD

The disclosed systems relate in general to the field of sensing, and in particular to sensors that are able to determine movement and other environmental changes based on phase shift.

BRIEF DESCRIPTION OF THE DRAWINGS

The foregoing and other objects, features, and advantages of the disclosure will be apparent from the following more particular description of embodiments as illustrated in the accompanying drawings in which reference characters refer to the same parts throughout the various views. The drawings are not necessarily to scale, emphasis instead being placed upon illustrating principles of the disclosed embodiments.

DETAILED DESCRIPTION

The present disclosure is directed to sensor systems that are adapted to determine movement based on measured phase shift signals that occur in the signal space.

As used herein, and especially within the claims, ordinal terms such as first and second are not intended, in and of themselves, to imply sequence, time or uniqueness, but rather, are used to distinguish one claimed construct from another. In some uses where the context dictates, these terms may imply that the first and second are unique. For example, where an event occurs at a first time, and another event occurs at a second time, there is no intended implication that the first time occurs before the second time, after the second time or simultaneously with the second time. However, where the further limitation that the second time is after the first time is presented in the claim, the context would require reading the first time and the second time to be unique times. Similarly, where the context so dictates or permits, ordinal terms are intended to be broadly construed so that the two identified claim constructs can be of the same characteristic or of different characteristics. Thus, for example, a first and a second frequency, absent further limitation, could be the same frequency, e.g., the first frequency being 10 Mhz and the second frequency being 10 Mhz; or could be different frequencies, e.g., the first frequency being 10 Mhz and the second frequency being 11 Mhz. Context may dictate otherwise, for example, where a first and a second frequency are further limited to being frequency-orthogonal to each other, in which case, they could not be the same frequency.

This application contemplates principles used in fast multi-touch sensors and other interfaces disclosed in the following: U.S. Pat. Nos. 9,933,880; 9,019,224; 9,811,214; 9,804,721; 9,710,113; and 9,158,411. Familiarity with the disclosure, concepts and nomenclature within these patents is presumed. The entire disclosure of those patents and the applications incorporated therein by reference are incorporated herein by reference. This application also contemplates principles used in fast multi-touch sensors and other interfaces disclosed in the following: U.S. patent application Ser. Nos. 15/162,240; 15/690,234; 15/195,675; 15/200,642; 15/821,677; 15/904,953; 15/905,465; 15/943,221; 62/540,458, 62/575,005, 62/621,117, 62/619,656 and PCT publication PCT/US2017/050547, familiarity with the disclosures, concepts and nomenclature therein is presumed. The entire disclosure of those applications and the applications incorporated therein by reference are incorporated herein by reference.

Figure 1:
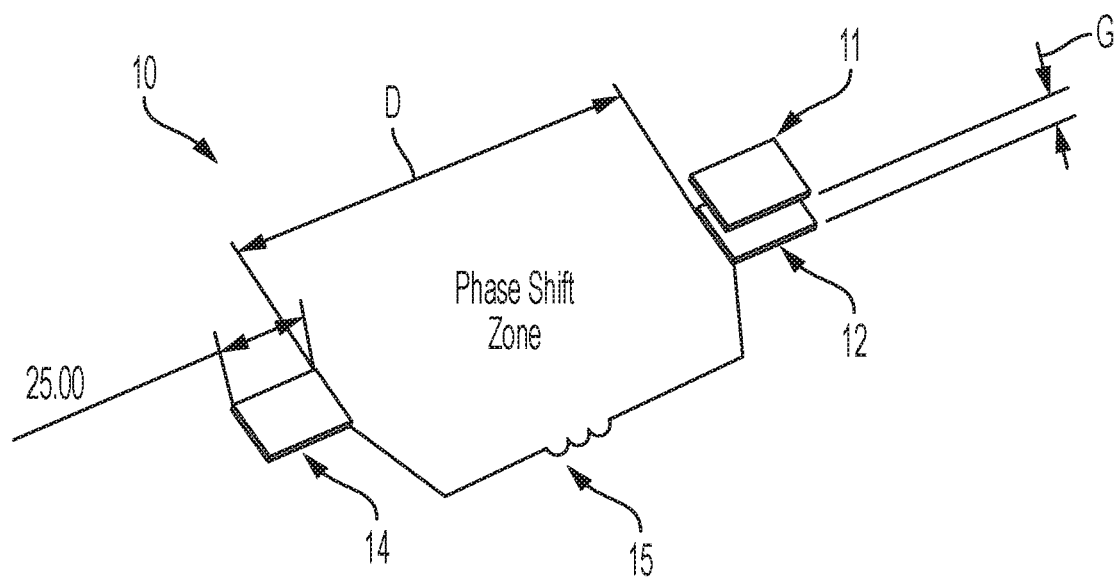
FIG. 1 is a schematic view of a sensor adapted to determine movement based on phase.

FIG. 1 is a diagram of a sensor system 10 that is adapted to determine the movement of an object using changes in phase of a measured signal. The sensor system 10 comprises a receiving conductor 11, a transmitting conductor 12, a transmitting conductor 14 and a phase shift element 15 that are all operably connected together within the same sensor system 10. In FIG. 1, the phase shift element 15 is an inductor. In an embodiment, some of the components are operably connected to other systems in addition to the sensor system 10. The sensor systems disclosed herein further comprise a processor or processors (not shown) that are adapted to process measurements of the signals received at the receiving conductor 11. In an embodiment, the phase shift element 15 is operably located between the transmitting conductor 12 and the transmitting conductor 14.

The transmitting conductors 12 and 14 are operably connected to signal generators. In the embodiment shown in FIG. 1, the transmitting conductors 12 and 14 are formed as square shaped plates that are placed so that an edge of transmitting conductor 12 is facing an edge of transmitting conductor 14. In FIG. 1, transmitting conductor 12 and transmitting conductor 14 are square shaped so that the dimension of each edge with respect to the other edge is equal.

In an embodiment, transmitting conductors are shaped as discs lying on edge with respect to each other (i.e. the perimeter of one disc is facing the perimeter of the other disc). In an embodiment, transmitting conductors are shaped as rectangles lying on edge with respect to each other, with the longer of the sides facing each other. In an embodiment, transmitting conductors are shaped as rectangles lying on edge with respect to each other, with the shorter of the sides facing each other. In an embodiment, transmitting conductors are shaped as cylinders, with the sides of the cylinders facing each other. In an embodiment, transmitting conductors are shaped as irregular polygons lying with respect to each other with at least one of the sides facing each other. In an embodiment, transmitting conductors are shaped as triangles with at least one side of the triangles facing each other.

In FIG. 1, the transmitting conductors 12 and 14 are separated by a predetermined distance D. In an embodiment, the distance D is between 1 mm and 10 m. In an embodiment, the distance between D is between 1 mm and 10 mm. In an embodiment, the distance D is between 1 mm and 100 mm. In an embodiment, the distance D is between 10 mm and 800 mm. In an embodiment, the distance D is between 100 mm to 350 mm.

In an embodiment, the distance D varies depending on the time frame, for example, in an embodiment, the distance D is 10 mm in a first time frame and in a second time frame the distance is 50 mm. In an embodiment, the distance D varies during a first phase that is a calibration phase and in a second phase the distance D remains steady. In an embodiment, the distance D varies during a first phase that is a calibration phase and in a second phase the distance D remains steady, then in a third phase the distance D varies again as recalibration is performed.

The receiving conductor 11 is located above the transmitting conductor 12 and separated by a gap G of distance 10 mm. In an embodiment, the gap G is a distance of 1 mm. In an embodiment, the gap G is a distance of 1 M. In an embodiment the gap G varies in distance between a close distance and a far distance during different time periods. In an embodiment, the gap G In an embodiment, the space occupying the gap G between the receiving conductor and the transmitting conductors is filled with air. In an embodiment, the space occupying the gap G is filled with a medium other than air. In an embodiment, the space occupying the gap G is filled with water. In an embodiment, the space occupying the gap G is filled with a solid. In an embodiment, skin is located between the receiving conductor and transmitting conductor. In an embodiment, a fluid is located between the receiving conductor and the transmitting conductor. In an embodiment, composite compositions are located between the receiving conductor and the transmitting conductor.

Still referring to FIG. 1, the transmitting conductors 12 and 14 are adapted to each transmit the same signal frequency. Operably connected within the system 10 between transmitting conductor 12 and 14 is a phase shift element 15. In an embodiment, the inductance provided by the phase shift element 15 is between 10 mH and 500 mH. In an embodiment, the inductance provided by the phase shift element 15 is between 100 mH and 400 mH. In an embodiment, the inductance provided by the inductor is between 150 mH and 300 mH. Preferably, the phase shift element 15 is correlated with the transmit frequency and to the transmitting area so as to shift the phase approximately 180 degrees between the two transmitting conductors. In an embodiment, the phase shift element 15 is one of a plurality of inductors that is adapted to provide inductance within a variety of ranges. In an embodiment, the phase shift element 15 is an inductor adapted to provide inductance within a variety of ranges. In an embodiment, the phase shift element 15 is variably adapted to adjust its inductance in relation to corresponding adjustments in with respect to the transmitting conductors 12 and 14 and the receiving conductor 11.

In another embodiment, instead of an inductor a capacitor is used so as to yield a phase shift between the two transmitting conductors. In an embodiment, instead of an inductor a resistor is used to yield a phase shift between the two transmitting conductors. In an embodiment a RLC (also referred to as resonant circuit) is used to yield a phase shift between the two transmitting conductors.

Located in the space between the transmitting conductors 12 and 14 is a phase shift zone. Certain objects that move within the area between the transmitting conductors 12 and 14 impact the phase shift of the signals received by the receiving conductor 11. By processing measurements of the signals received by the receiving conductor 11 the system 10 is able to use the processed signals to determine whether an object is moving closer to one transmitting conductor 12 or the other transmitting conductor 14. In addition to the system 10 being able to determine which transmitting conductor is being approached, the measurements of the signals received and then processed by the system can also be impacted by the distance in the Z direction (i.e. the distance above or below the plane in which the transmitting conductors lie).

FIG. 1 shows an arrangement of a sensing system 10. Other arrangements utilizing the same types of components may be used in order to create complex zones in which capacitive objects can be sensed. Different zones along different axes can be created using the same type of arrangement. If the arrangement in FIG. 1 is considered to form a sensing zone along the X axis another arrangement may be established so as to form a sensing zone along the Y axis. Additionally, another arrangement may be established in order to form a sensing zone along the Z axis. Other directions and more complex arrangements may be established provided that there is little interference between the phase zones that are established. In the particular arrangements, each of the transmitting pairs may transmit signals that are orthogonal with respect to each other so that each of the respective pairs of transmitting conductors can be distinguished from each other pair of transmitting conductors.

In an embodiment, a sensing system establishes a sensing zone along the Y axis. In an embodiment a sensing system establishes a sensing zone along the Z axis. In an embodiment, a sensing system establishes sensing zones along the X and Y axes. In an embodiment, a sensing system establishes sensing zones along the X and Z axes. In an embodiment, a sensing system establishes sensing zones along the X and Y axes. In an embodiment, a sensing system establishes sensing zones along the X, Y and Z axes. In an embodiment, a sensing system establishes a sensing zone along the X, Y and Z axes and combinations of the axes. When establishing multiple sensing zones multiple phase shift elements may be placed between each respective pair of transmitting antennas.

In an embodiment, a sensing system establishes a sensing zone along perimeters of geometric shapes. For example, the sensing system establishes sensing zones along the perimeters forming the four corners of a square. In an embodiment, the sensing system establishes sensing zones along the perimeters forming the three sides of a triangle. In an embodiment, the sensing system establishes sensing zones along the perimeters forming the sides of a cube. In an embodiment, the sensing system establishes sensing zones along the perimeters forming the sides of a pyramid.

In an embodiment, the sensing system establishes sensing zones along the contours of an object or device. For example, in an embodiment, the sensing system establishes sensing zones that cover the contours of a seat. In an embodiment, the sensing system establishes sensing zones along the contours of a vehicle. In an embodiment, the sensing system establishes sensing zones along the contours of a doorway. In an embodiment, the sensing system establishes sensing zones along the contours of a room.

In an embodiment, a capacitive object moving within the phase shift zones impacts the phase of the signals being transmitted and received. The sensing system's measurements and processing of the received signals enable the sensing system to track a capacitive object as it moves within the phase shift zone. So in a simple example, the movement of a hand or an object through the phase zone that is oriented along an axis can be determined.

In an embodiment, the sensor system can be located within a room that has established a number of phase zones, a person moving within the room is tracked by the sensing system. In an embodiment, the sensing system is placed proximate to or within a seat location in a vehicle and the placement of a person in the seat is determined. In an embodiment, the sensing system is placed in an airplane and the location of people within an airplane are tracked. In an embodiment, the sensing system is placed within a train and the location of a person within the train is determined.

In an embodiment, the motion of transmitting conductor 14 relative to transmitting conductor 12 causes a phase shift. Measurement of the signals permits tracking of the distance between the two transmitters as with detecting the motion of a ball screw assembly of a linear slide or other linear motion elements. By determining the motion of one transmitting conductor with respect to another the movement of various components within a system or at a location can be determined.

In an embodiment, changing the angular orientation of transmitting conductor 14 relative to transmitting conductor 12 causes a phase shift. Measurement of the signals permits tracking of the relative angle between the two transmitters as with detecting the motion of a mirror gimbal or other such rotational motion elements. By determining the motion of one transmitting conductor with respect to another the movement of various components within a system or at a location can be determined.

In an embodiment, changing the size and shape of the transmitting conductors leads to a phase shift. Measurement of the signals permits detecting stretching or deformation of one or both of the transmitting conductors. This determination of stretching and deformation of the surfaces to which the transmitting conductors are operably connected or the transmitting conductors are connected are used for detecting the motion of telescoping mechanical elements. In an embodiment, the determination of stretching and deformation of surfaces are used for the detecting movements or change in surface size of liquid filled bladders, etc.

In an embodiment, with a flexible inductor, bending, stretching or compressing the inductor will lead to a phase shift. Measurement of the signals permits understanding of the bend state of the flexible inductor and/or the position of one transmitting conductor relative to another transmitting conductor.

Figure 2:
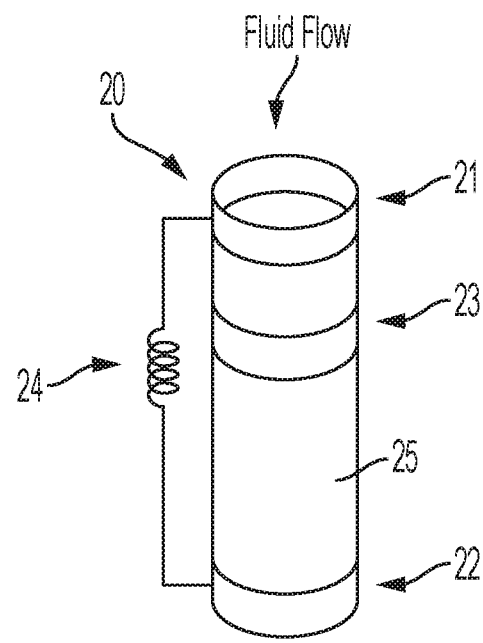
FIG. 2 is a schematic view of a sensor adapted to determine changes in dielectric properties of a fluid based on phase.

FIG. 2 shows sensing system 20. Sensing system 20 is adapted for use in or with a pipe that is adapted to have fluid passing through it. In an embodiment, the pipe is adapted to lie on the seafloor. In an embodiment, the pipe is adapted to lie under the sea floor. In embodiment, the pipe is adapted to lie on a riverbed. In an embodiment, the pipe is adapted to lie under a riverbed. In an embodiment, the pipe is adapted to lie within a sewage system. In an embodiment, the pipe is adapted to lie within a water system.

Referring to FIG. 2, fluid flowing in the pipe 25 passes within the space between transmitting conductor 21 and transmitting conductor 22. The passing of fluid through the space between transmitting conductor 21 and transmitting conductor 22 alters the phase of signal received at receiving conductor 23. There are various properties that can impact the dielectric properties of a fluid. For example, the proportion of solids versus water can impact the dielectric properties for a fluid. The composition of oil can impact the phase of a signal. The composition of air can impact the dielectric properties. Using the sensing system 20, the composition of the fluid flowing through the pipe 25, and changes to the composition of the flow can be measured.

In FIG. 2, an inductor 24 connects the two transmitting conductors 21 and 22 in order to facilitate determination of the phase shift in the system. In an embodiment a capacitor or other RLC network component supplies the phase shift.

In an embodiment, the sensing system 20 is able to be implemented in an air duct. The sensing system 20 is able to measure the dust and solid composition of air flowing in an AC duct by measuring the change in phase. The metrics establishing the dust and solid composition of the air can be used to determine the filter loading. This can then be used to establish when the air filter needs to be replaced. In an embodiment, the phase measurements are used to determine humidity of the air.

In an embodiment, the sensing system 20 is oriented vertically in a tank filled with fluid. The level of the fluid within the tank relative to the sensing system 20 impacts the phase shift determined by the sensing system 20.

Figure 3:
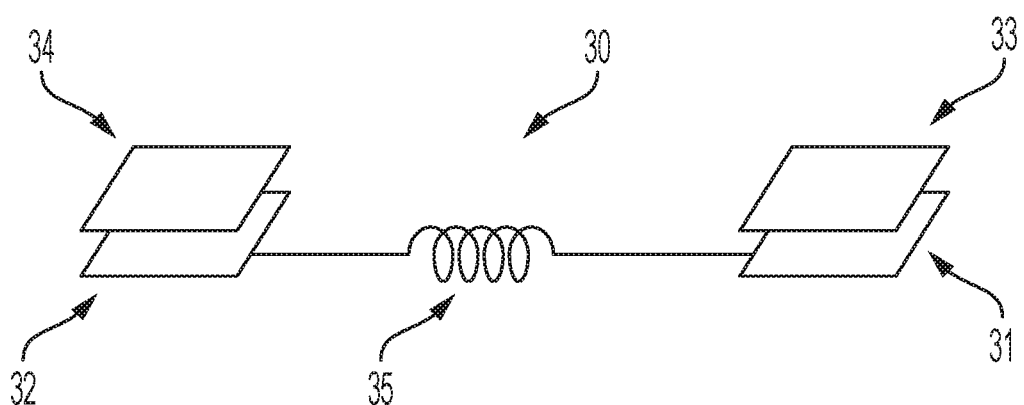
FIG. 3 is a schematic view of a sensor adapted to determine phase shift with a differential signal.

FIG. 3 shows sensing system 30. Sensing system 30 comprises two transmitting conductors 31 and 32 with and two receiving conductors 33 and 34. The transmitting conductors are connected with an inductor 35. This configuration can be used similarly to the applications and embodiments discussed above when referencing FIG. 1. However, the difference between the measurements made at receiving conductors 33 and 34 can establish a differential signal from the measurements received. As with the embodiments discussed above, a capacitor or RLC network can supply the phase shift function for inductor 35 with similar results to the phase shift mechanism.

In an embodiment, a plurality of transmitting conductors and receiving conductors are connected by inductors, capacitors or RLC networks. In the embodiments described above, the systems are high Q series passive resonator systems. In an embodiment, these systems are implemented as high Q parallel passive resonator systems.

Figure 4:
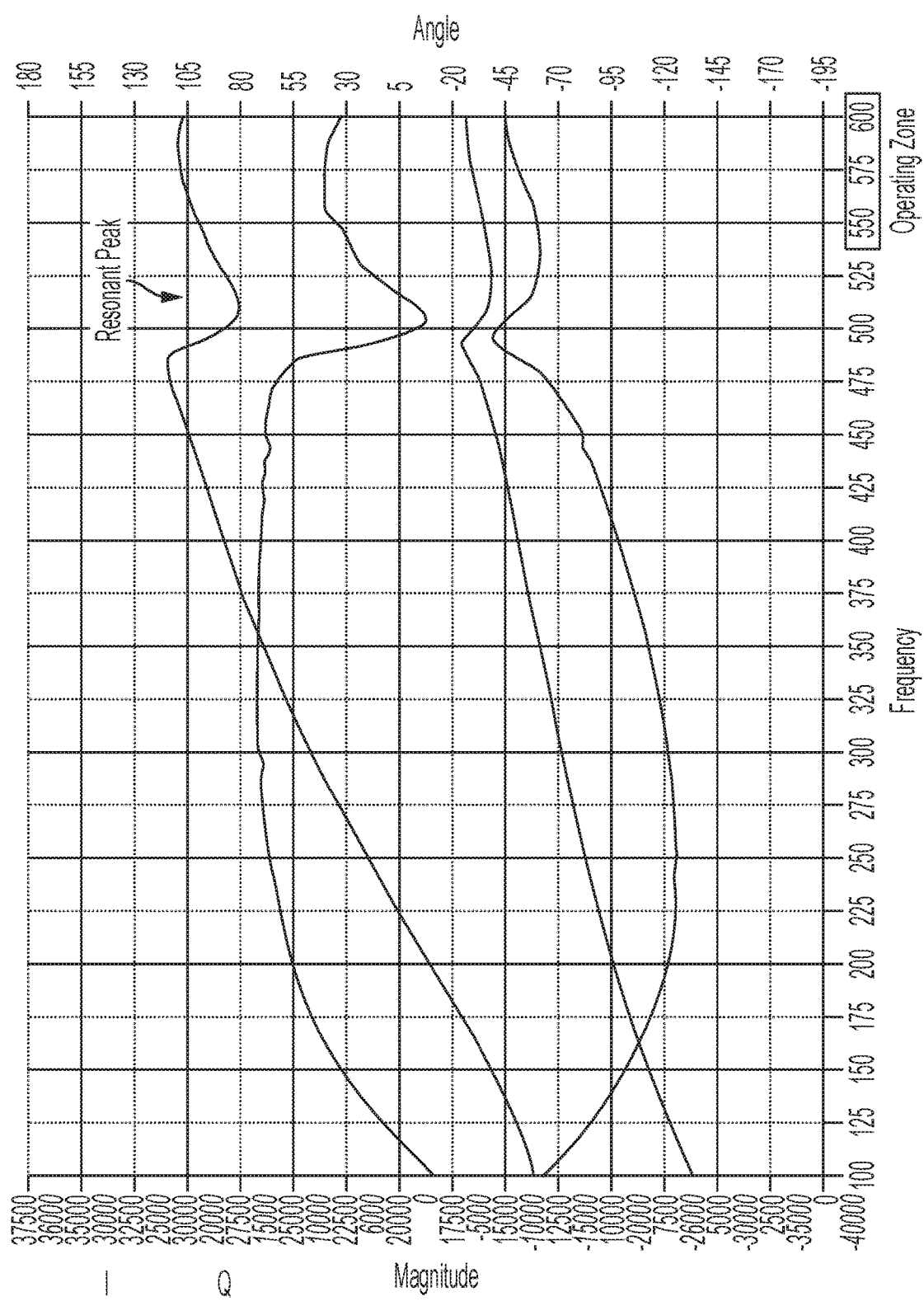
FIG. 4 shows a plot of I, Q, magnitude and phase versus drive frequency for a sensor.

FIG. 4 shows a response curve of a sensor, such as that shown in FIG. 1. The response curve varies depending upon the frequency of the signal at which it is driven. In an embodiment, a sensor design is characterized and the operating point is chosen at a higher frequency than a resonance point for the chosen sensor design. Some amount of tuning may be required depending on the application, either by changing the phase shift elements, or changing the size/shape of the transmitter conductors. In the basic operation of the sensing system, such as sensing system 10 discussed above, a resonant frequency for the sensing system is determined. After the determination of a resonant frequency, a transmitting frequency is selected at a higher frequency than the resonant frequency of the sensing system, a baseline Fast Fourier Transform (FFT) measurement is taken at the transmitted bin frequency. I and Q measurements from the FFT bin of interest are subtracted from the baseline measurements. Deviations from the baseline are interpreted as phase shifts. Phase shifts correspond with capacitive object location between the transmitting conductors.

An aspect of the present disclosure is a sensor system. The sensor system comprising: a first transmitting conductor adapted to transmit a first signal at a frequency; a second transmitting conductor adapted to transmit a second signal that is out of phase from the first signal transmitted at the frequency; a phase shift element operably connected to the first transmitting conductor and the second transmitting conductor; a receiving conductor adapted to receive signals transmitted from the first transmitting conductor and the second transmitting conductor; and a processor adapted to process measurements of change in phase of received signals from the first transmitting conductor and the second transmitting conductor to determine movement of an object within a phase shift zone formed between the first transmitting conductor and the second transmitting conductor.

While the invention has been particularly shown and described with reference to a preferred embodiment thereof, it will be understood by those skilled in the art that various changes in form and details may be made therein without departing from the spirit and scope of the invention.

The invention claimed is:

1. A sensor system comprising:
a first transmitting conductor adapted to transmit a first signal at a frequency;
a second transmitting conductor adapted to transmit a second signal that is out of phase from the first signal transmitted at the frequency;
a phase shift element operably connected to the first transmitting conductor and the second transmitting conductor;
a receiving conductor adapted to receive signals transmitted from the first transmitting conductor and the second transmitting conductor;
a processor adapted to process measurements of change in phase of received signals from the first transmitting conductor and the second transmitting conductor to determine movement of an object within a phase shift zone formed between the first transmitting conductor and the second transmitting conductor; and
further comprising a third transmitting conductor located distally from the first transmitting conductor, wherein a second phase shift element is located between the first transmitting conductor and the third transmitting conductor.

2. The sensor system of claim 1, wherein the phase shift element is an inductor.

3. The sensor system of claim 1, wherein the phase shift element is a capacitor.

4. The sensor system of claim 1, wherein the phase shift element comprises at least one of a resistor, inductor, or capacitor.

5. The sensor system of claim 1, wherein the phase shift element is operably connected between the first transmitting conductor and the second transmitting conductor.

6. The sensor system of claim 1, wherein the object is a capacitive object.

7. The sensor system of claim 6, wherein the gap is filled with a dielectric material.

8. The sensor system of claim 1, further comprising a gap formed between the first transmitting conductor and the receiving conductor.

9. The sensor system of claim 8, wherein the gap is filled with air.

10. The sensor system of claim 1, wherein a position of the first transmitting conductor with respect to the second transmitting conductor changes over time.

11. The sensor system of claim 1, wherein the first transmitting conductor and the second transmitting conductor have a variable distance between them.

12. The sensor system of claim 1, wherein the first transmitting conductor and the second transmitting conductor are differently shaped.

13. The sensor system of claim 1, wherein the first transmitting conductor and the second transmitting conductor are differently sized.

14. The sensor system of claim 1, wherein a property of the phase shift element changes to alter measurements of phase.

15. The sensing system of claim 1, wherein the first transmitting conductor and the second transmitting conductor are formed as squares.

16. The sensing system of claim 15, wherein the first transmitting conductor and the second transmitting conductor are positioned to be on edge with respect to each other.

17. The sensing system of claim 1, wherein the sensing system is operably connected to a conduit of fluid.

18. The sensing system of claim 1, wherein the fluid is water.

19. The sensing system of claim 1, wherein a frequency of the signal transmitted is higher than a resonant frequency of the sensor system.

* * * * *